United States Patent [19]
Ward et al.

[11] 4,144,489
[45] Mar. 13, 1979

[54] SIMPLIFIED FREQUENCY TO DIGITAL CONVERTER USING ALL DIGITAL ELECTRONICS

[75] Inventors: Phillip W. Ward, Dallas; Halbert H. Bybee, Jr., Richardson, both of Tex.

[73] Assignee: Texas Instruments Incorporated, Dallas, Tex.

[21] Appl. No.: 508,489

[22] Filed: Sep. 23, 1974

[51] Int. Cl.² ............................................. G01R 23/02
[52] U.S. Cl. .................................. 324/78 D; 324/82; 324/83 D
[58] Field of Search ..................... 324/79 D, 82, 78 D, 324/78 R, 83 D; 340/347; 331/1 A, 25

[56] References Cited
U.S. PATENT DOCUMENTS

| | | | |
|---|---|---|---|
| 3,160,815 | 12/1964 | Ford et al. | 324/82 |
| 3,502,977 | 3/1970 | Richman et al. | 324/82 |
| 3,764,903 | 10/1973 | Griswold | 324/83 D |
| 3,997,764 | 12/1976 | Belmonte | 324/78 D |

Primary Examiner—M. Tokar
Attorney, Agent, or Firm—Rene' E. Grossman; Leo N. Heiting; Thomas G. Devine

[57] ABSTRACT

An all digital circuit converts a signal of an unknown frequency into an accurate binary representation of that frequency. The apparatus consists of an all digital closed loop system which has as its input the unknown signal. The closed loop system generates a reference signal and forces the frequency thereof to approximate that of the unknown signal. In so doing, the closed loop generates a binary number representative of the frequency of the reference signal and provides this number as the system output.

13 Claims, 3 Drawing Figures

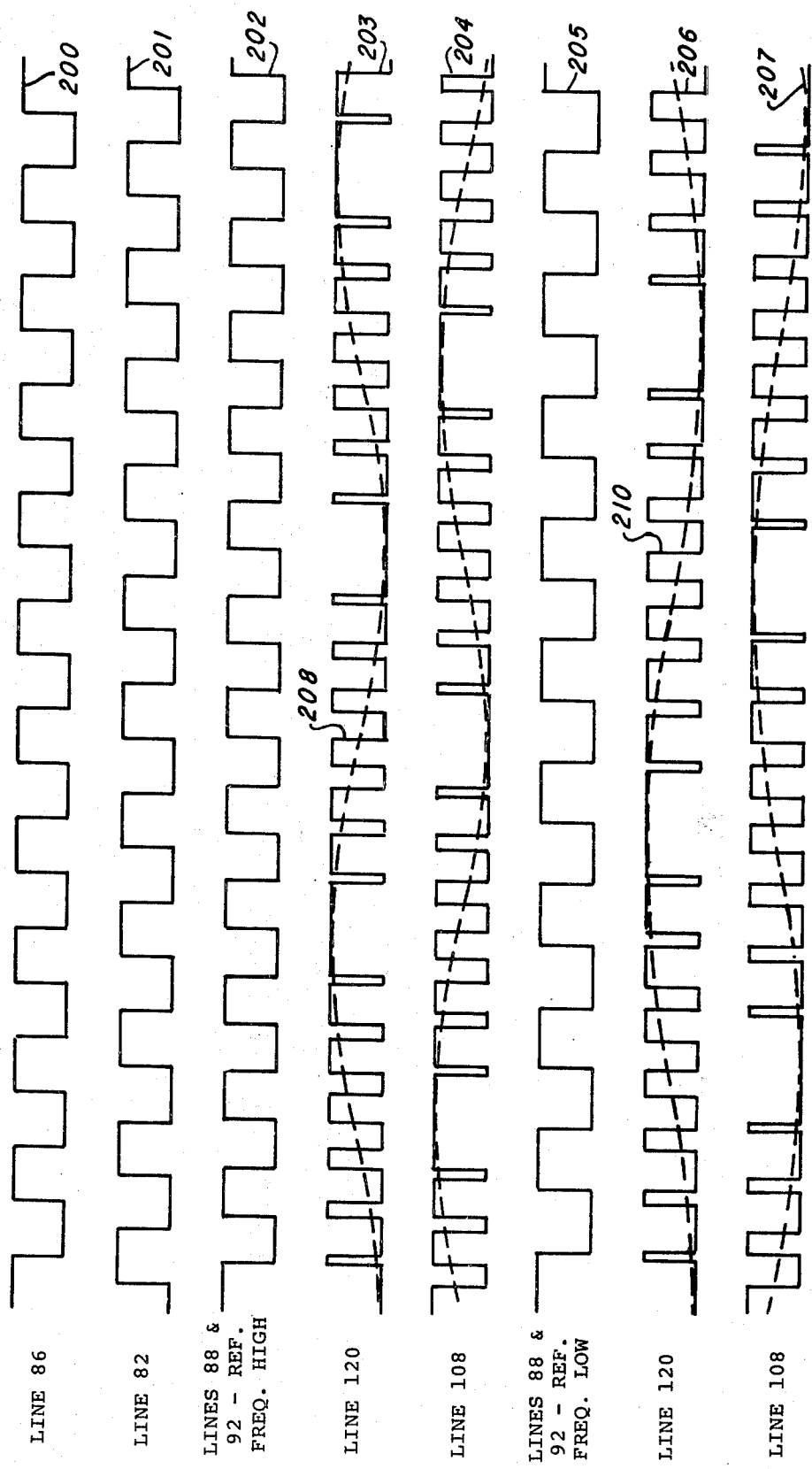

SIMPLIFIED FREQUENCY TO DIGITAL CONVERTER USING ALL DIGITAL ELECTRONICS

This invention relates to frequency to digital conversion and in particular to a simplified frequency to digital converter using all digital electronics.

There exist various types of apparatus for providing digital signals representative of an unknown frequency of a continuous waveform. Commercially available digital counters commonly employed in many laboratories are a well known example of this type of apparatus. Such digital counters typically count the number of cycles of the unknown waveform which occur within a predetermined number of cycles of an internal clock waveform. Since the frequency of the internal clock is precisely known, this procedure provides sufficient information for the counter to compute the frequency of the unknown waveform. The resultant frequency is digitized for display purposes.

Digital counters of the type described above suffer from several inherent weaknesses in certain applications. First, it is clear from their method of operation that the computed frequency is not representative of the frequency of the unknown signal at some specific point in time. On the contrary, the computed frequency is representative of the average frequency of the unknown signal during that period of time over which the unknown signal was counted. A second difficulty stems from the fact that the unknown signals typically are corrupted by noise and are as a consequence rarely monochromatic. As a result of this noise, the number of cycles counted during a count period may not be the number of cycles of the unknown signal which actually occurred during that count period. Consequently, the resultant computed frequency will differ from the true average frequency of the unknown waveform during the count period.

Other types of apparatus have been built to provide a digital representation of the frequency of a pulsed carrier frequency signal where the signal contains significant energy levels only intermittently. It is well known, for example, that such signals occur in pulsed doppler sonar or radar systems, DME and ATC navigation and identification systems, surveillance radar, ECM and even microwave ovens. In pulsed doppler sonar systems for example a transducer aboard a vessel is typically used to impart to the water short pulses of monochromatic ultrasonic energy. Portions of this energy after reflection from the ocean bottom or other reflecting interfaces will be returned to the transducer after experiencing a doppler frequency shift resulting from the motion of the vessel relative to the reflecting interface. Comparison of the frequency of these returned pulses with the frequency of the transmitted pulses allows computation of the doppler frequency shift and consequently of the relative velocity of the vessel.

While the return pulses of ultrasonic energy occur only intermittently it is common practice to provide on the vessel a local oscillator having a continuous wave output signal. A phased locked loop is employed to force the local oscillator to operate at the frequency of the energy in the return pulses. As a result, it will be seen that the local oscillator provides a continuous wave signal having a frequency which is representative of the frequency of the most recently returned doppler pulse energy. A system of this type is described in U.S. Pat. No. 3,719,923 to Glen Noble Watermann.

In such pulsed doppler systems it is common practice to process the frequency of the continuous wave local oscillator signal in a special purpose shipboard computer for generating accurate navigational information. It thus becomes necessary to digitize the local oscillator frequency for subsequent use in the special purpose computer. This digitization may be accomplished using techniques analagous to those employed in the digital counters first described above. This approach, however, provides just one averaged frequency sample from each time gate over which the local oscillator frequency is counted. Further, the combination of the phase lock loop with the frequency-to-digital converter results in apparatus of considerable complexity.

It is an object of the present invention therefore to provide an improved frequency-to-digital conversion method and system.

It is a further object of the present invention to provide a frequency-to-digital converter using all digital electronics.

It is another object of this invention to provide apparatus for yielding a continuous digital representation of the instantaneous frequency of a pulsed carrier frequency signal at all times when the energy of the signal is above a preselected threshold level.

It is still a further object of this invention to provide a frequency-to-digital converter with the noise rejection capabilities of a digital phase locked loop.

The above and other objects of the present invention are realized in a converter employing a digital phase detector which compares the frequency of the unknown signal with the frequency of a locally generated reference signal. The digital phase detector produces a first frequency count signal the time variability of which is proportional to the frequency difference between the unknown and reference signals. A second binary output signal of the digital phase detector is indicative of whether the frequency of the reference signal exceeds or is less than that of the unknown frequency.

These two outputs of the digital phase detector are used to control the clock and down/up inputs respectfully of an up/down binary counter. The down/up input is structured so as to make the counter count down when the reference signal frequency exceeds that of the unknown signal and count up when the contrary situation prevails. The multibit digital number output of the binary counter is coupled to the rate inputs of a binary rate multiplier (BRM). The clock input of the BRM is provided by a local clock having a known, precisely controlled frequency. The output of the BRM is a pulse train having a pulse repetition rate proportional to the product of the clock pulse repetition rate and the binary number input to the BRM rate inputs. This pulse train, after division in a binary divider circuit, forms the reference signal input to the digital phase detector.

It will be recognized by those skilled in the art that the above described system comprises a digital phase locked loop which forces the frequency of the reference signal to conform to that of the unknown signal. Moreover, the digital number output of the binary counter is linearly related to the frequency of this reference signal and may be converted by a simple linear transformation to a digital number which is continuously representative of the instantaneous frequency of the reference signal.

Since the loop forces the reference signal frequency to conform to that of the unknown signal, this transformed digital number is also representative of the instantaneous frequency of the unknown signal.

The above and other objects, features and advantages of the present invention may be better understood by consideration of the following detailed discussion in conjunction with the accompanying drawings in which:

FIG. 3 shows various digital waveforms illustrative of the operation of the digital phase detector.

Figure 1:
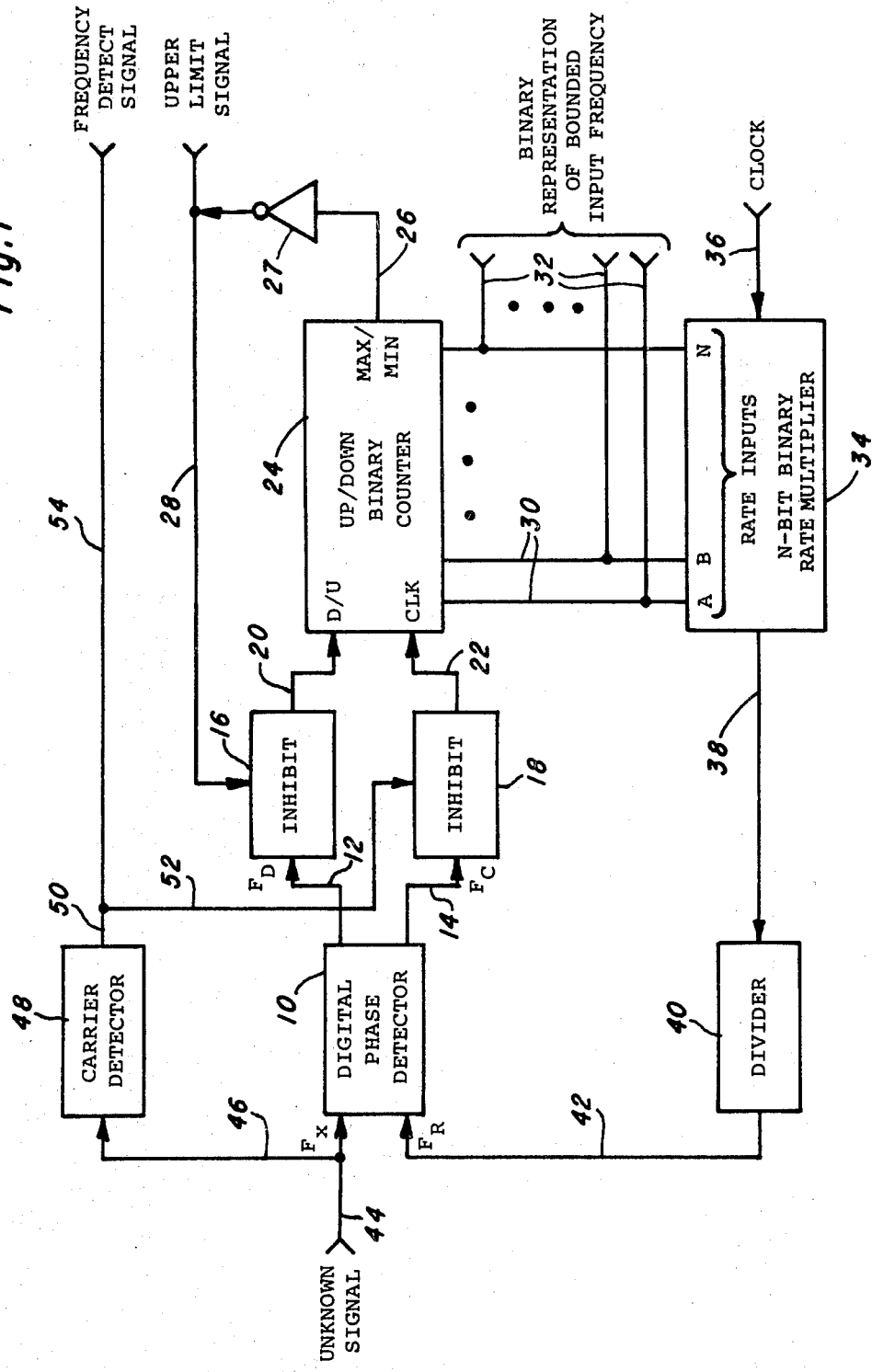
FIG. 1 is a diagram of the frequency to digital converter employing all digital electronics.

With reference to FIG. 1, the unknown signal is coupled by line 44 to one input of digital phase detector 10. This input is indicated generally by the symbol $F_x$. A second input is coupled to digital phase detector 10 by line 42 and is indicated generally by symbol $F_R$. Two outputs from the digital phase detector appearing on line 12 and 14, respectively, are designated $F_D$ and $F_C$. The signal appearing on line 12 is coupled by inhibit circuit 16 and line 20 to a down/up input of up/down binary counter 24. Similarly, the signal appearing on line 14 is coupled by inhibit circuit 18 and line 22 to the clock input of binary counter 24. The N bit binary number output of binary counter 24 is coupled by means of lines 30 to the rate inputs of BRM 34. This multibit binary number is also provided as an external signal by means of lines 32. The clock input of BRM 34 is provided on line 36 by an external clock source. The pulse train output of BRM 34 is coupled by means of lines 38 to divider circuit 40, the output of which comprises the reference signal appearing on line 42.

The unknown signal appearing on line 44 is also coupled by line 46 to carrier detector 48, the output of which is connected by lines 50 and 52 to a second input of inhibit circuit 18. The output of carrier detector 48 is also provided on line 54 as an external frequency detect signal. The max/min output of binary counter 24 is coupled by line 26, inverter 27 and line 28 to a second input of inhibit circuit 16. This max/min output is also provided as an external upper limit signal.

Figure 2:
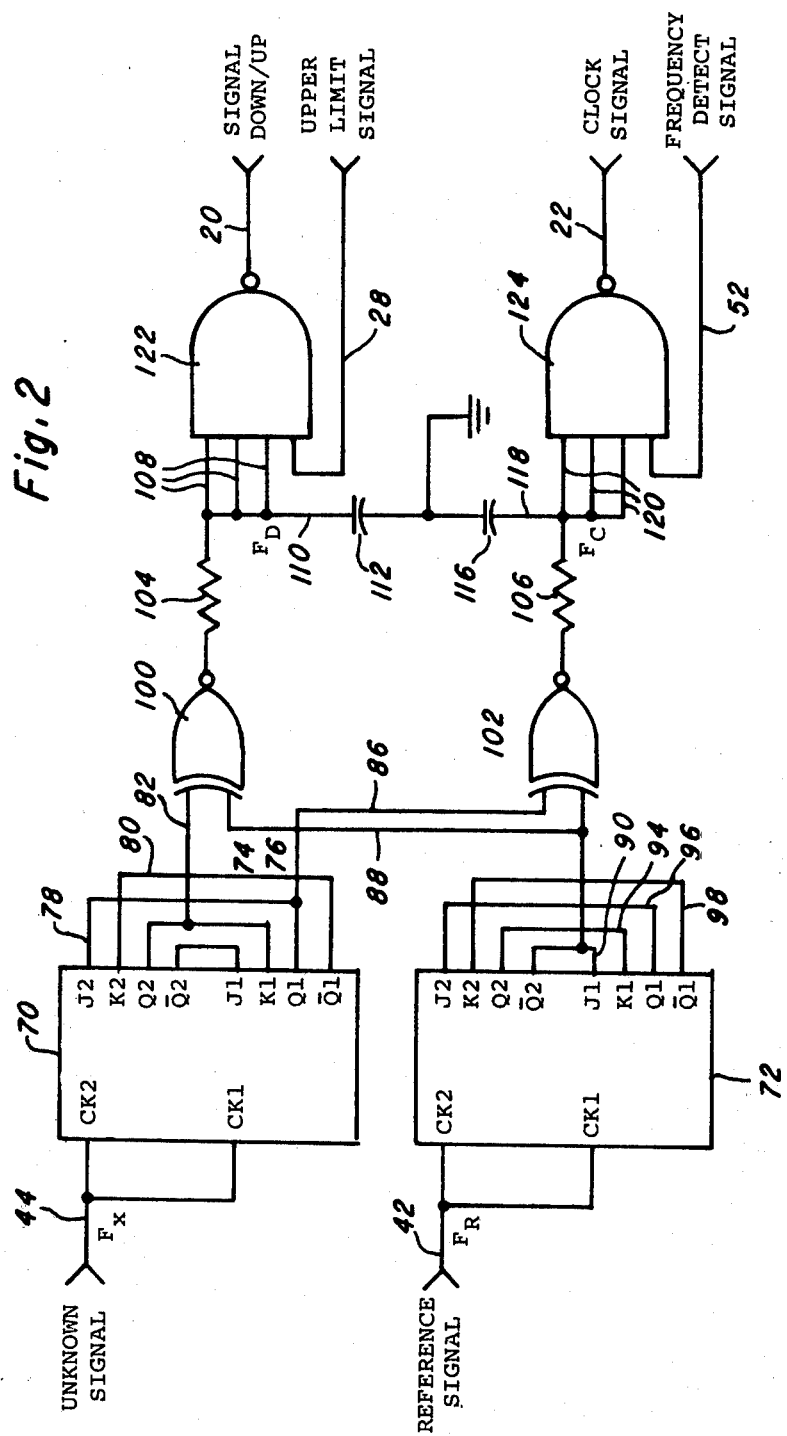
FIG. 2 is a detailed diagram showing the digital phase detector.

Specific structural details relating to digital phase detector 10 and inhibit circuits 16 and 18 are shown in FIG. 2 and will be discussed subsequently. Various types of up/down binary counters are available in integrated circuit form, a Texas Instruments model no. SN 74191N having been employed in the preferred embodiment of the invention. BRM 34 in the preferred embodiment is a Texas Instruments model no. SN7497N. The binary divide function represented by divider 40 may be performed with a model SN 7473N dual J-K flip-flop connected as a divide by four network. Carrier detector 48 may be a Signetics model NE 567 phased lock loop tone decoder. It will be noted that a Texas Instruments model SN 7491N binary counter has a four bit digital output whereas as model SN 7497N BRM has a six bit rate input. The four bit counter output may be coupled to any consecutive four bits of the BRM rate input, the specific four bits so chosen determining in connection with the clock frequency the range of frequencies that may be output on line 38. Alternatively, it may be desired to couple together two model SN 7491N binary counters in cascade so as to provide an eight bit binary output. Any desired consecutive six bits of this binary output may be coupled so as to provide the full six bit input to BRM 34. Inverter 27 may be implemented with a model no. SN 7404N integrated circuit.

Operationally, the unknown signal on line 44 and reference signal on line 42 are applied as logic signals to digital phase detector 10. Phase detector 10 compares the frequencies of the unknown and reference signals to generate an approximately sinusoidal signal on line 14 having a frequency proportional to the frequency difference between the unknown and reference signals. This line 14 signal is converted to a square wave and inverted by inhibit circuit 18 and will in general be coupled to the clock input of binary counter 24 by line 22. In this way the clock rate of the binary counter is seen to be proportional to the frequency difference between the unknown and reference signals. The second output of phase detector 10 appearing on line 12 is an approximately sinusoidal signal having the same frequency (but 90° out of phase) as the signal appearing on line 14. The signal on line 12 is converted to a square wave and inverted in inhibit circuit 16 and will, in the absence of an inhibit signal, be transmitted along line 20 to the down/up input of binary counter 24. It will be seen subsequently that the down/up signal appearing on line 20 will cause binary counter 24 to count down in response to clock signals appearing on line 22 when the reference signal frequency exceeds that of the unknown signal. Conversely, binary counter 24 will count up when the frequency of the unknown signal exceeds that of the reference signal.

The N bit binary output of binary counter 24 is coupled by means of lines 30 to the rate input of BRM 34. As is well known the BRM output frequency $F_0$ appearing on line 38 is given by:

$$F_0 = M \cdot F_I / 2^N \qquad (1)$$

Where:
$F_I$ is the frequency of the clock input appearing on line 36,
N is the number of bits in the multibit binary number appearing on line 30,
$M = A \cdot 2^0 + B \cdot 2^1 + C \cdot 2^2 + \ldots + \Omega \cdot 2^{N-1}$, and
A, B, C, ..., $\Omega$ are the logic levels of the bit positions of the multibit binary number in increasing order of significance.

The frequency $F_0$ of the BRM output signal is divided in divider 40 by some integer K to produce the reference signal on line 42 having a frequency $F_R$ given by:

$$F_R = F_0 / K \qquad (2)$$

It will be understood from the foregoing that the apparatus of FIG. 1 comprises a closed loop system which operates to reduce the frequency of the reference signal when that frequency exceeds the frequency of the unknown signal and functions to increase the frequency of the reference signal when that frequency is less than the frequency of the unknown signal. In other words, the system comprises a digital phase locked loop serving to equalize the frequencies of the reference and unknown signals. Assume that the frequency error between the unknown and reference signals is negligibly small in this closed loop system:

$$F_x \cong F_R \qquad (3)$$

where $F_x$ is the frequency of the unknown signal. It follows from the combination of equations (1) through (3) that $$M = F_x \cdot (K \cdot 2^N / F_I) = F_x \cdot L \qquad (4)$$

where $L = K \cdot 2^N / F_I$, a constant.

Thus, M, the N bit binary number appearing on line 32 as an output of the system, is linearly related to the frequency of the unknown signal by a constant L. The constant L may be removed prior to display or subsequent processing of the binary number M. Thus, it is seen that the apparatus of FIG. 1 provides a continuous binary representation of the instantaneous frequency of the unknown signal.

Up to this point, the unknown signal has been assumed to be present continuously. In various applications, such as the aforementioned pulsed carrier frequency systems, however, there may be measurable signal energy on line 44 only intermittently corresponding to the pulses of carrier frequency. This signal energy is coupled by line 46 to carrier detector 48 which monitors the energy level and provides a high level binary signal on line 50 when the unknown signal energy exceeds a preselected threshold. This high level binary signal appearing on lines 50 and 52 causes inhibit circuit 18 to couple the signals appearing on line 14 to line 22. If the unknown signal energy level is less than the preselected threshold, the binary output of carrier detector 48 will be in the low state thereby causing inhibit circuit 18 to prevent the passage of clock pulses to line 22. This inhibit feature provides the system with an infinite sample and hold capability during those time periods between the occurrence of measurable pulses on line 44. A low level carrier detector output appearing on line 54 as an external signal from the phase locked loop may be used in external circuitry as an indication that the loop is not presently locking the reference signal frequency to that of the unknown signal.

A second disabling feature is provided by inhibit circuit 16. If at any time up/down binary counter 24 has counted to the top of its range, it is desirable that the counter be prevented from further counting in an increasing direction. If the binary output of the counter is not at a maximum, the max/min counter output appearing on line 26 will occupy a low state. This is inverted by inverter 27 to provide a high state on line 28 to inhibit circuit 16. This high input to inhibit circuit 16 permits the signal on line 12 to be coupled to line 20. If binary counter 24, however, reaches the upper end of its output range, the max/min output on line 26 will switch to the high state thereby resulting in a low state appearing on line 28. As will be understood subsequently, the down/up signal appearing on line 20 will remain high as long as the signal appearing on line 28 remains low. This high signal on line 20 causes binary counter 24 to count down in response to clock input on line 22 irrespective of the state of signal appearing on line 12. Thus, binary counter 24 is prevented from ever counting up beyond the maximum of its range.

This upper limit signal is also provided as an external output on line 29 to indicate to external circuitry those time periods when the phase locked loop is not functioning in the normal tracking mode.

Operation of digital phase detector 10 and of inhibit circuits 16 and 18 may be understood with reference to the circuit diagram of FIG. 2 and the waveforms of FIG. 3. In FIG. 2 the unknown signal $F_x$ is coupled by line 44 to both clock inputs of a J-K master-slave flip-flop 70. In the preferred embodiment flip-flop 70 is implemented with a Texas Instruments model SN 7473N integrated circuit. In FIG. 2 a "1" appearing in a terminal designation of the flip-flop indicates that the terminal is connected to the master flip-flop, while a "2" appearing in a terminal designation indicates that that terminal is connected to the slave flip-flop. The $\overline{Q}_2$ output is coupled to the J1 input by line 74. Line 76 couples the Q2 output to the K1 input. The Q1 output is coupled to the J2 input by line 78 while line 80 couples the $\overline{Q}1$ output to the K2 input.

Reference signal $F_R$ is coupled by line 42 to the two clock inputs CK1 and CK2 of a second J-K master-slave flip-flop 72 which may also be implemented with a Texas Instruments model SN 7473N integrated circuit. The J-K, Q and $\overline{Q}$ terminals of flip-flop 72 are coupled in a manner identical to the corresponding terminals of flip-flop 70 by means of lines 90, 94, 96 and 98. The Q2 output of flip-flop 70 appearing on line 82 forms one input to exclusive OR circuit 100. The Q1 output of flip-flop 70 appearing on line 86 forms one input to exclusive OR circuit 102. The $\overline{Q}2$ output of flip-flop 72 is coupled by lines 88 and 92 to form the second inputs to each of exclusive OR gates 100 and 102. The exclusive OR gate function may be provided with a Texas Instrument model SN 7486 integrated circuit. The output of exclusive OR gate 100 is connected to resistor 104 and thence via lines 108 to three inputs of Schmitt trigger circuit 122. Schmitt trigger circuits 122 and 124 may be implemented with a Texas Instruments model SN 7413 integrated circuit. Logically, this circuit functions as a four input NAND gate but because of the Schmitt action, the gate has different input threshold levels for positive and negative going signals. The hysteresis or backlash, which is the difference between the two threshold levels, is typically 800 millivolts. The output of resistor 104 is also connected by line 110 to capacitor 112 the other end of which is tied to ground by line 114. The fourth input to Schmitt trigger 122 appearing on line 28 is the upper limit signal also shown in FIG. 1.

A similar configuration of circuit elements appears at the output of exclusive OR circuit 102 which is connected to resistor 106. The output of the resistor is coupled by lines 120 to three inputs of Schmitt trigger circuit 124 and also by line 118 to capacitor 116. The other side of capacitor 116 is also grounded by line 114. The fourth input of Schmitt trigger 124 appearing on line 52 is the frequency detect signal also shown in FIG. 1.

Operation of the digital phase detector may be understood with aid of the logic diagrams of FIG. 3. The unknown signal $F_x$ is coupled by line 44 to both clock inputs of J-K master-slave flip-flop 70. It will be recognized by those skilled in the art that flip-flop 70 is connected as a Gray code counter and that the signals appearing at its Q1 and Q2 outputs will be square waves each having a fundamental frequency equal to one fourth the fundamental frequency of the unknown signal. Moreover, the phase of the square wave appearing at the Q2 output will lag the phase of the square wave appearing at the Q1 output by 90°. This is illustrated by logic waveforms 200 and 201 of FIG. 3 representing, respectively, the Q1 output coupled by line 86 to one input of exclusive OR gate 102 and the Q2 output coupled by line 82 to one input of exclusive OR gate 100.

J-K master-slave flip-flop 72 has both clock inputs responsive to the reference signal appearing on line 42 and is similarly connected as a Gray code counter. Accordingly, the $\bar{Q}2$ output of flip-flop 72 is a square wave having a fundamental frequency equal to one fourth that of the reference signal. This square wave represented by waveform 202 of FIG. 3 is coupled by lines 88 and 92 to the second inputs of exclusive OR gates 100 and 102. The condition represented by waveform 202 is that existing when the reference signal fundamental frequency is higher than that of the unknown signal. Under these conditions the logic signal appearing at the output of exclusive OR gate 102 is illustrated by solid line waveform 203. This signal is filtered by the lowpass filter consisting of resistor 106 and capacitor 116. This lowpass filter is selected to filter out the carrier frequency appearing in waveform 203 and thereby to provide an approximately sinusoidal waveform at lines 120 to three of the inputs of Schmitt trigger circuit 124. This approximately sinusoidal waveform is shown as the superimposed dashed-curve on waveform 203. Its frequency is proportional to the difference between the frequencies of the unknown and reference signals.

For the present, it will be assumed that the inhibit signals appearing on lines 28 and 52 both occupy the high state. Under these conditions Schmitt trigger circuit 124 serves to convert the approximately sinusoidal waveform appearing on lines 120 to a square wave and to invert the resulting square wave. It will be seen, therefore, that the clock signal appearing on line 22 will be a square wave 180° out of phase with the sinusoidal signal appearing at line 20 and depicted as the dashed-curve of waveform 203. It is important to note at this point that the square wave clock signal appearing on line 22 will undergo a negative to positive excursion at a time indicated by reference designator 208 of FIG. 3.

The output of exclusive OR gate 100 shown as solid logic waveform 204 in FIG. 3 is similarly filtered by a low pass filter composed of resistor 104 and 112. This results in an approximately sinusoidal waveform at lines 108 shown by the dashed curve superimposed on logic waveform 204. This approximately sinusoidal waveform is squared and inverted by Schmitt trigger circuit 122 thereby producing a square wave down/up signal on line 20. Since this square wave will be 180° out of phase with the sinusoidal signal appearing on lines 108, the square wave will be seen to occupy the high state at time 208 indicated in FIG. 3.

As shown in FIG. 1, the clock signal appearing on line 22 is coupled to the clock input of up/down binary counter 24. The counter changes its output count in response to negative-to-positive going transitions of the clock signal such as that which occurs at time 208 of FIG. 3. At such time, as discussed previously, the square wave appearing on line 20 and coupled to the down/up input of the binary counter will occupy the high state. This has the effect of causing the binary counter to count down in response to the clock pulse appearing on line 22. The decremented output count of the binary counter will serve to reduce the frequency of the signal appearing on line 38 and ultimately to reduce the frequency of the reference signal appearing on line 42. In this way the closed loop system is seen to force the frequency of the reference source to approach that of the unknown signal.

The configurations of the corresponding signals when the frequency of the reference source is less than that of the unknown signal are illustrated by waveforms 205, 206 and 207 of FIG. 3. Under this condition it will be seen that the square wave clock signal appearing on line 22 will undergo a low-to-high transition at a time indicated by reference designator 210 of FIG. 3. At this time the square wave down/up signal appearing on line 20 will be seen to occupy the low state. Accordingly, binary counter 24 will count up in response to the low-to-high transition of the clock signal at time 210. This increment in the binary counter output ultimately results in an increased reference signal frequency and the reference signal is again seen to be driven to approximate frequency synchronism with the unknown signal.

The mode of operation described above is altered by the presence of a low level inhibit signal on either of lines 28 or 52. As discussed previously, when the energy content of the unknown signal appearing on line 44 falls below a preselected threshold level the output of carrier detector 48 appearing on line 50 will switch from a high to a low state. This low state coupled by line 52 to one input of Schmitt trigger circuit 124 has the effect of inhibiting the appearance of any further clock pulses on line 22. Accordingly, during such times the output of binary counter 24 will remain constant at the last count acquired under the control of measurable values of the unknown signal. It will be understood by those skilled in the art, therefore, that the system possesses an infinite sample and hold capability.

If at any time the output count of binary counter 24 reaches the maximum of its dynamic range the constant high level max/min output appearing on line 26 and inverted to a low state by inverter 27 is coupled by line 28 to one input of Schmitt trigger circuit 122. The low level signal appearing on line 28 has the effect of maintaining the down/up signal appearing on line 20 in the high state as long as the max/min output of binary counter 24 remains high. Under these conditions binary counter 24 will count down in response to clock pulses appearing at its clock input. This inhibit feature prevents overflow of binary counter 24.

While in the preferred embodiment, the up/down counter 24 and rate multiplier 34 have been implemented with pure binary modules, these functions could equally well be implemented with binary coded decimal (BCD) modules. In this case, the frequency to digital conversion could be in base 10 (BCD) display form. The unique method of frequency conversion provided by the invention would greatly reduce the cost of and simplify frequency measurement instrumentation which provides an output in base ten (BCD) display form.

There has been disclosed a unique method and system for providing a binary representation of the frequency of an unknown signal. Whereas the invention has been described with respect to specific embodiments thereof, it should be understood that various changes and modifications will be suggested to ones skilled in the art and it is intended to encompass those changes and modifications as fall within the scope of the appended claims.

What is claimed is:

1. A system for providing an accurate binary representation of the frequency of an unknown signal comprising:
(a) digital phase detector means for generating a digital error signal proportional to the difference in the frequency of said unknown signal and that of a reference signal, and
(b) digital closed loop means responsive to said digital error signal and operatively connected to equalize said reference signal with said unknown signal, said digital closed loop further providing a binary representation of the frequency of said reference signal.

2. The system of claim 1 wherein said digital error signal comprises a first pulse train with a pulse repetition rate proportional to the frequency difference between said unknown and reference signals and a second binary signal the state of which is indicative of whether the frequency of said reference signal is greater or less than that of said unknown signal.

3. A system for providing an accurate binary representation of the frequency of an unknown signal comprising:
   (a) digital phase detector means for generating a digital error signal proportional to the difference in the frequency of said unknown signal and that of a reference signal, said digital error signal comprising a first pulse train with a pulse repetition rate proportional to the frequency difference between said unknown and reference signals and a second binary signal the state of which is indicative of whether the frequency of said reference signal is greater or less than that of said unknown signal,
   (b) a binary counter for counting the pulses of said first pulse train wherein the count direction is controlled by the state of said second binary signal,
   (c) a clock for producing a second pulse train with a constant pulse repetition rate, and
   (d) a binary rate multiplier response to said second pulse train and to the output of said binary counter for generating said reference signal, the frequency of said reference signal being proportional to the product of the pulse repetition rate of said second pulse train and the binary number output of said binary counter.

4. The system of claim 3 wherein said closed loop means further comprises digital divider means responsive to the reference signal output of said binary rate multiplier for reducing phase jitter in said reference signal before it is compared in said digital phase detector.

5. The system of claim 3 further comprising means for automatically setting the state of said second binary signal to make said binary counter count down whenever its output count reaches the maximum count capability of said counter.

6. A system for converting the frequency of an unknown signal to a binary representation thereof, comprising:
   (a) digital phase detector means for generating a digital error signal representative of the frequency difference between said unknown signal and a reference signal,
   (b) digital integrator means for producing a multibit binary number representative of the time integral of said error signal, and
   (c) digital feedback loop means for generating said reference signal and for maintaining the frequency thereof proportional to the product of said multibit number and a preselected frequency.

7. The conversion system of claim 6 wherein the error signal generated by said digital phase detector means comprises a pulse train with an instantaneous pulse repetition rate proportional to the frequency difference between said unknown and reference signals and a second binary signal the state of which is indicative of whether the frequency of said reference signal is greater than or less than that of said unknown signal.

8. The conversion system of claim 7 wherein said digital integrator means comprises a binary coded decimal up/down counter and said digital feedback loop means includes a binary coded decimal binary rate multiplier responsive to the output of said up/down counter.

9. A method for continuously providing an accurate binary representation of the frequency of an unknown signal comprising:
   (a) digitally generating an error signal representative of the frequency difference between said unknown signal and a reference signal,
   (b) digitally integrating said error signal to produce a multibit binary number,
   (c) multiplying the pulse repetition rate of a clock by said multibit binary number to produce said reference signal, and
   (d) linearly transforming said multibit binary number to provide a binary representation of the frequency of said unknown signal.

10. The method of claim 9 wherein said step of generating further comprises producing a first pulse train with a pulse repetition rate proportional to the frequency difference between said unknown and reference signals, and producing a second binary signal to indicate which of said unknown and reference signals has the greater frequency.

11. The method of claim 10 wherein said step of digitally integrating comprises counting the pulses of said first pulse train, the direction of counting being up or down in accordance with the state of said second binary signal.

12. The method of claim 10 further comprising the step of monitoring the short term energy level of said unknown signal and inhibiting the generation of said first pulse train when said short term energy level drops below a preselected threshold.

13. A system for providing an accurate binary representation of the frequency of an unknown signal comprising:
   (a) digital phase detector means for generating a digital error signal proportional to the difference in the frequency of said unknown signal and that of a reference signal, said digital error signal comprising a first pulse train with a pulse repetition rate proportional to the frequency difference between said unknown and reference signals and a second binary signal the state of which is indicative of whether the frequency of said reference signal is greater or less than that of said unknown signal,
   (b) digital closed loop means responsive to said digital error signal and operatively connected to equalize said reference signal with said unknown signal, said digital closed loop further providing a binary representation of the frequency of said reference signal, and
   (c) a carrier detector for monitoring the short term average power of said unknown signal and for inhibiting the generation of said first pulse train when said average power falls below a predetermined threshold level.

* * * * *